United States Patent
Kim et al.

(10) Patent No.: US 11,716,870 B2
(45) Date of Patent: Aug. 1, 2023

(54) TRANSPARENT DISPLAY DEVICE AND MANUFACTURING METHOD OF THE SAME

(71) Applicant: LG Display Co., Ltd., Seoul (KR)

(72) Inventors: EunJu Kim, Paju-si (KR); JongHyun Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/992,893

(22) Filed: Nov. 22, 2022

(65) Prior Publication Data
US 2023/0090582 A1 Mar. 23, 2023

Related U.S. Application Data

(63) Continuation of application No. 17/104,671, filed on Nov. 25, 2020, now Pat. No. 11,539,018.

(30) Foreign Application Priority Data

Nov. 29, 2019 (KR) .................. 10-2019-0157233

(51) Int. Cl.
*H10K 50/822* (2023.01)
*H10K 59/35* (2023.01)
*H10K 71/00* (2023.01)
*G09G 3/20* (2006.01)

(52) U.S. Cl.
CPC ........... *H10K 50/822* (2023.02); *H10K 59/35* (2023.02); *H10K 71/00* (2023.02); *G09G 3/20* (2013.01); *G09G 2310/0275* (2013.01)

(58) Field of Classification Search
CPC .............................. H10K 50/822; H10K 59/35
See application file for complete search history.

(56) References Cited

U.S. PATENT DOCUMENTS

| | | | |
|---|---|---|---|
| 10,903,451 B2* | 1/2021 | Lee | H10K 50/824 |
| 2005/0184676 A1* | 8/2005 | Hori | H05K 7/20972 |
| | | | 315/169.3 |
| 2013/0021593 A1* | 1/2013 | Onvlee | B65H 23/245 |
| | | | 414/676 |
| 2013/0146875 A1* | 6/2013 | Mandlik | H10K 50/828 |
| | | | 257/52 |
| 2013/0336004 A1* | 12/2013 | Mulder | B60Q 3/217 |
| | | | 362/609 |
| 2017/0069871 A1* | 3/2017 | Yim | H10K 50/844 |
| 2017/0117337 A1* | 4/2017 | Kimura | H10K 50/805 |
| 2018/0122863 A1* | 5/2018 | Bok | G06F 3/0446 |
| 2018/0284927 A1* | 10/2018 | Kim | H10K 59/131 |
| 2018/0315387 A1* | 11/2018 | Park | G09G 3/3674 |
| 2019/0006437 A1 | 1/2019 | Lin et al. | |

(Continued)

FOREIGN PATENT DOCUMENTS

TW 201906150 A 2/2019

OTHER PUBLICATIONS

Taiwan Intellectual Property Office, Office Action, TW Patent Application No. 109141850, dated Aug. 6, 2021, 12 pages.

(Continued)

*Primary Examiner* — Caleb E Henry
(74) *Attorney, Agent, or Firm* — Fenwick & West LLP

(57) ABSTRACT

Disclosed relates to a transparent display panel and manufacturing method of thereof, and the transparent display panel including a patterned cathode with improved transparency as a whole.

10 Claims, 18 Drawing Sheets

(56) References Cited

U.S. PATENT DOCUMENTS

| | | | | |
|---|---|---|---|---|
| 2019/0058020 A1* | 2/2019 | Tsai | ............... | H10K 59/131 |
| 2019/0165333 A1* | 5/2019 | Harada | ............... | H01L 27/1244 |
| 2019/0369423 A1* | 12/2019 | Kim | ............... | G02F 1/1336 |
| 2020/0081569 A1* | 3/2020 | Zhou | ............... | G06F 3/0412 |
| 2020/0127225 A1* | 4/2020 | Zhang | ............... | H10K 59/124 |

OTHER PUBLICATIONS

United States Office Action, U.S. Appl. No. 17/104,671, dated Jun. 6, 2022, 11 pages.

\* cited by examiner

FIG.17
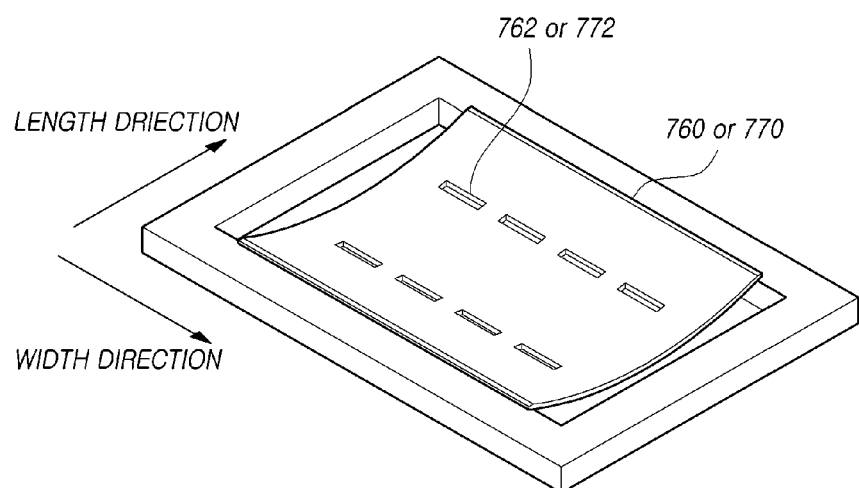
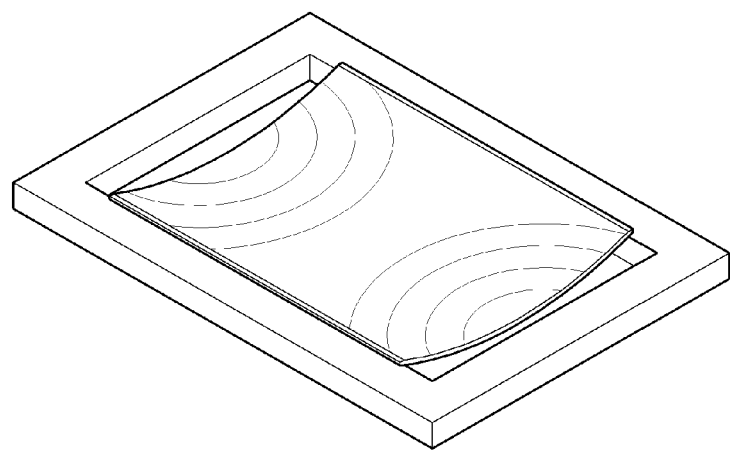

TRANSPARENT DISPLAY DEVICE AND MANUFACTURING METHOD OF THE SAME

CROSS REFERENCE TO RELATED APPLICATIONS

This application is a continuation application of U.S. patent application Ser. No. 17/104,671 filed on Nov. 25, 2020, which claims priority from Republic of Korea Patent Application No. 10-2019-0157233, filed on Nov. 29, 2019, all of which are hereby incorporated by reference for all purposes as if fully set forth herein.

BACKGROUND

Field

The present disclosure relates to a transparent display panel and a manufacturing method thereof and more particularly to a transparent display panel including a patterned cathode with improved transparency as a whole and a manufacturing method thereof.

Discussion of the Related Art

With advancement in information-oriented societies, requirements for display devices displaying an image have increased in various forms, and various types of display devices such as a liquid crystal display device, a plasma display device, and an organic light emitting display device have been widely utilized.

Demand for a transparent display panel using transparent elements and a transparent display device including such a transparent display panel has increased.

SUMMARY

Transparent display panels according to the related art have a problem in that a function of a transparent display panel is not appropriately performed due to a decrease in transmittancy or transparency. Accordingly, transparent display panels have not been commercially used.

The inventors of the present disclosure invented a transparent display panel including a patterned cathode with improved transparency as a whole and a manufacturing method thereof.

Embodiments of the present disclosure are not limited to the above-mentioned problems and other problems which have not been mentioned will be apparently understood from the following description by those skilled in the art.

According to an embodiment of the present disclosure, there are provided a transparent display panel including a patterned cathode with improved transparency as a whole and a manufacturing method thereof.

According to an embodiment of the present disclosure, there is a provided a transparent display panel including a substrate, an anode that is disposed on the substrate, a light emitting layer that is disposed on the anode, and a patterned cathode that is disposed on the light emitting layer.

The anode is disposed in each emission area out of a plurality of emission areas and a plurality of transmission areas on the substrate. The light emitting layer is disposed on the anode in each emission area. The patterned cathode is disposed on each light emitting layer in the emission areas and the transmission areas, and is formed by opening at least a part of each transmission area.

According to another embodiment of the present disclosure, there is a provided a method of manufacturing a transparent display panel, the method including a step of forming an anode on a substrate, a step of forming a light emitting layer on the anode, and a step of forming a patterned cathode on the light emitting layer.

In the step of forming an anode, the anode is formed in each emission area out of a plurality of emission areas and a plurality of transmission areas on the substrate.

In the step of forming a light emitting layer, the light emitting layer is formed on the anode in each emission area out of the plurality of emission areas and the plurality of transmission areas on the substrate.

In the step of forming a patterned cathode, the patterned cathode in which at least a part of each transmission area is open is formed on each light emitting layer formed on the substrate in the emission areas and the transmission areas.

According to another embodiment of the present disclosure, there is provided a transparent display device including the transparent display panel. The transparent display device includes the transparent display panel and driving circuits that drive the transparent display panel.

With the transparent display panel and a manufacturing method thereof according to the embodiments of the present disclosure, it is possible to improve transparency as a whole by including the patterned cathode.

The present disclosure is not limited to the above-mentioned advantages and other advantages will be apparently understood from the following description by those skilled in the art.

BRIEF DESCRIPTION OF THE DRAWINGS

FIG. 17 is a perspective view illustrating another example of first and second masks which are used in FIGS. 10 to 13 according to another embodiment.

DETAILED DESCRIPTION

Figure 1:
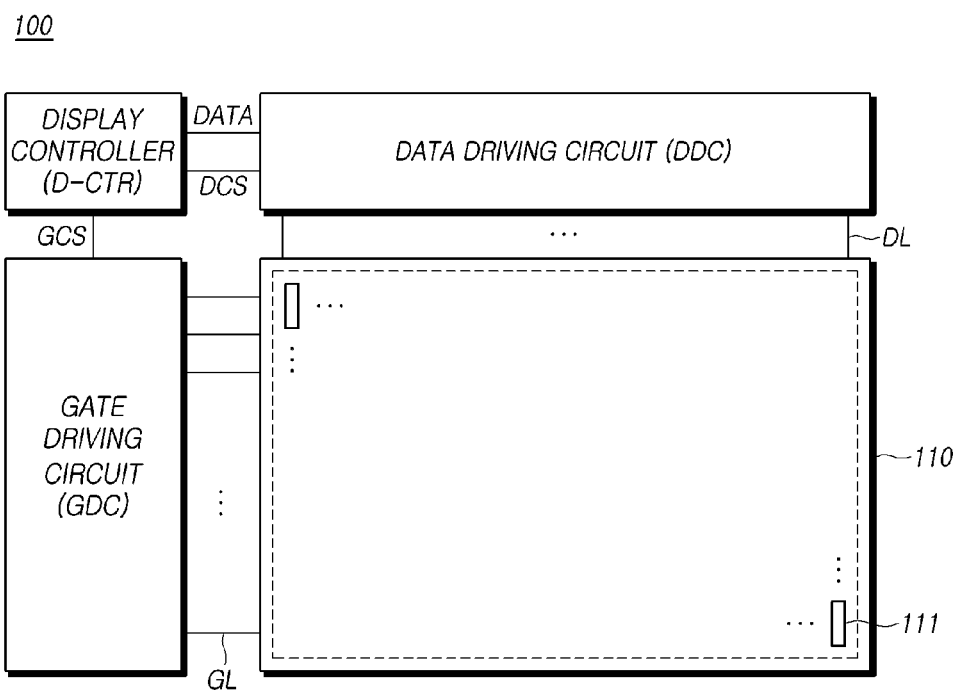
FIG. 1 is a diagram illustrating a system configuration of a display device according to an embodiment of the present disclosure.

Advantages and features of the invention and methods for achieving the advantages or features will be apparent from embodiments described below in detail with reference to the accompanying drawings. However, the invention is not limited to the embodiments but can be modified in various forms. The embodiments are provided merely for completing the disclosure of the invention and are provided for completely informing those skilled in the art of the scope of the invention. The scope of the invention is defined by only the appended claims.

Shapes, sizes, ratios, angles, number of pieces, and the like illustrated in the drawings, which are provided for the purpose of explaining the embodiments of the invention, are exemplary and thus the invention is not limited to the illustrated details. In the following description, like elements are referenced by like reference numerals. When it is determined that detailed description of the relevant known functions or configurations involved in the invention makes the gist of the invention obscure, the detailed description thereof will not be made. When "include," "have," "be constituted," and the like are mentioned in the specification, another element may be added unless "only" is used. A singular expression of an element includes two or more elements unless differently mentioned.

In construing elements, an error range is included even when explicit description is not made.

For example, when positional relationships between two parts are described using 'on,' 'over,' 'under,' 'beside,' and the like, one or more other parts may be disposed between the two parts unless 'just' or 'direct' is used.

In describing temporal relationships, for example, when the temporal order is described using 'after,' 'subseguent,' 'next,' and 'before,' a case which is not continuous may be included unless 'just' or 'direct' is used.

It will be understood that, although the terms "first," "second," and the like may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features (elements) of embodiments of the invention can be coupled or combined with each other or separated from each other partially or on the whole and can be technically interlinked and driven in various forms. The embodiments may be put into practice independently or in combination.

Various configurations of a transparent display panel with improved transparency according to an embodiment of the present disclosure and a method of manufacturing the transparent display panel will be described below.

Hereinafter, embodiments of the present disclosure will be described in detail with reference to the accompanying drawings.

FIG. 1 is a diagram illustrating a system configuration of a display device according to an embodiment of the present disclosure.

Referring to FIG. 1, a display device 100 according to an embodiment of the present disclosure includes a display panel 110 in which a plurality of data lines DL and a plurality of gate lines GL are arranged and a plurality of subpixels 111 which are defined by the plurality of data lines DL and the plurality of gate lines DL are arranged, a data driving circuit DDC that drives the plurality of data lines, a gate driving circuit GDC that drives the plurality of gate lines GL, and a controller D-CTR that controls the data driving circuit DDC and the gate driving circuit GDC.

The controller D-CTR supplies various control signals DCS and GCS to the data driving circuit DDC and the gate driving circuit GDC to control the data driving circuit DDC and the gate driving circuit GDC.

The display device 100 according to the embodiment of the present disclosure may be an organic light emitting display device, a liquid crystal display device, or a plasma display device.

When the display device 100 according to the embodiment of the present disclosure is an organic light emitting display device, each subpixel 111 which is disposed in the display panel 110 includes a light emitting element including an organic light emitting diode (OLED) which is a spontaneous light emitting element and a circuit element such as a driving transistor that drives the OLED. The types and the number of circuit elements constituting each light emitting element can be determined depending on a provided function, a design scheme, and the like.

The display panel 110 is a transparent display panel employing transparent elements. The display device 100 is a transparent display device including the transparent display panel 110. The transparent display panel 110 includes an emission area in which elements or circuits are disposed and a transmission area in which no element and no circuit are disposed to improve transparency.

The transparency of the transparent display panel 110 is determined as transparency of transmission areas X transparency of cathodes.

In general, in the transparent display panel 110, cathodes are deposited on the overall surfaces of the transmission areas and the emission areas using an open mask or an open metal mask (OMNI). Since the cathodes are deposited in the transmission areas, transparency of the transmission areas decreases and thus the transparency of the transparent display panel 110 decreases.

In order to solve this problem, the present disclosure provides a transparent display panel with improved transparency using a "patterned cathode" in which at least a part of the transmission areas is open and a manufacturing method thereof.

Figure 2:
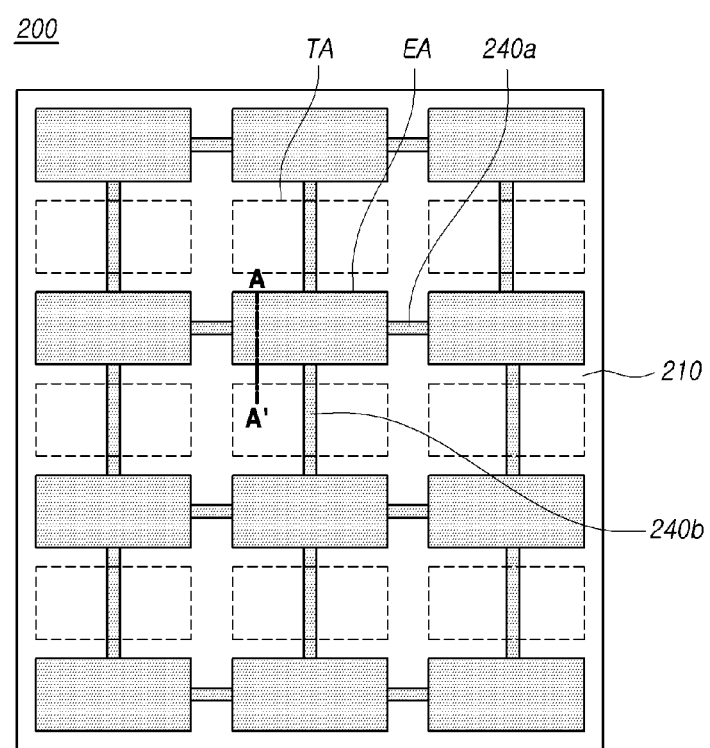
FIG. 2 is a plan view of a transparent display panel according to an embodiment.
Figure 3:
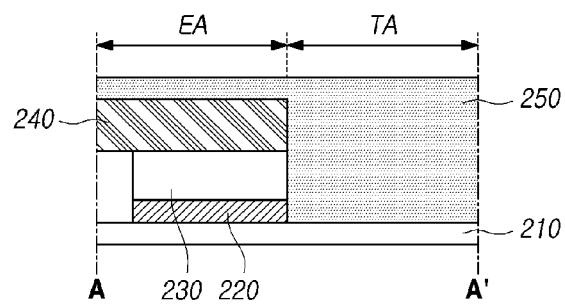
FIG. 3 is a sectional view taken along line A-A' in FIG. 2 according to an embodiment.

FIG. 2 is a plan view of a transparent display panel according to an embodiment. FIG. 3 is a sectional view taken along line A-A' in FIG. 2 according to an embodiment.

Referring to FIGS. 2 and 3, a transparent display panel 200 includes a substrate 210, an anode that is disposed in each emission area EA out of a plurality of emission areas EA and a plurality of transmission areas TA on the substrate 210, a light emitting layer 230 that is disposed on the anode 220 in each emission area EA, and a patterned cathode 240 that is disposed on the light emitting layer 230 in the emission area EA and is open in at least a part of the transmission areas. An encapsulation layer 250 may be disposed on the cathode 240.

The cathode 240 disposed in each emission area EA is electrically connected to the cathode 240 disposed in an emission area EA adjacent thereto.

For example, when the emission areas are directly adjacent to each other, the cathode 240 disposed in each emission area EA is connected to the cathode 240 disposed in the emission area EA adjacent thereto. That is, when the emission areas EA are directly adjacent to each other, the cathode disposed in each emission area EA is connected to the cathode 240 disposed in the emission area EA adjacent thereto via a first bridge 240a.

When the emission areas EA are adjacent to each other with a transmission area TA interposed therebetween, the cathode 240 disposed in each emission area EA is connected to the cathode 240 disposed in the emission area EA adjacent thereto via a first bridge 240a. When the emission areas EA are adjacent to each other, the cathode disposed in each emission area EA is connected to the cathode 240 disposed in the emission area EA adjacent thereto via a second bridge 240b.

The patterned cathode 240 is open in at least a part of the transmission area TA. If the cathode 240 is disposed in only the emission area EA and is not disposed in the overall transmission area TA, it is possible to improve transparency. However, when the cathodes 240 are disposed in only the emission areas EA, a common voltage, for example, a base voltage, cannot be commonly supplied to the cathodes 240.

Accordingly, by connecting the adjacent cathodes 240 using first and second bridges 240a and 240b as described above, the base voltage can be commonly supplied to the overall cathodes 240.

The thickness of the cathodes 240 disposed in the emission areas EA in this embodiment can be set in consideration of the magnitude of electric resistance and necessary transparency of the transparent display panel 200.

A transmission area TA is defined by a mask or a photoresist, the cathode 240 is not deposited in at least a part of the transmission area TA, that is, the transmission area TA in which the second bridge 240b is not disposed, and the cathode 240 is deposited in only the emission areas and the first and second bridges 240a and 240b, whereby it is possible to enhance transparency of the transmission area.

For example, a fine metal mask (FMM) can be applied to the transparent display panel 200 with a small area and a photoresist can be applied to the transparent display panel 200 with a large area, but the present disclosure is not limited thereto.

When a photoresist is used, a negative photoresist or a positive photoresist can be employed. When a negative photoresist is used, the photoresist is applied and is then exposed to ultraviolet (UV) light to develop the photoresist and to dispose the photoresist in only at least a part of the transmission area TA.

Figure 4:
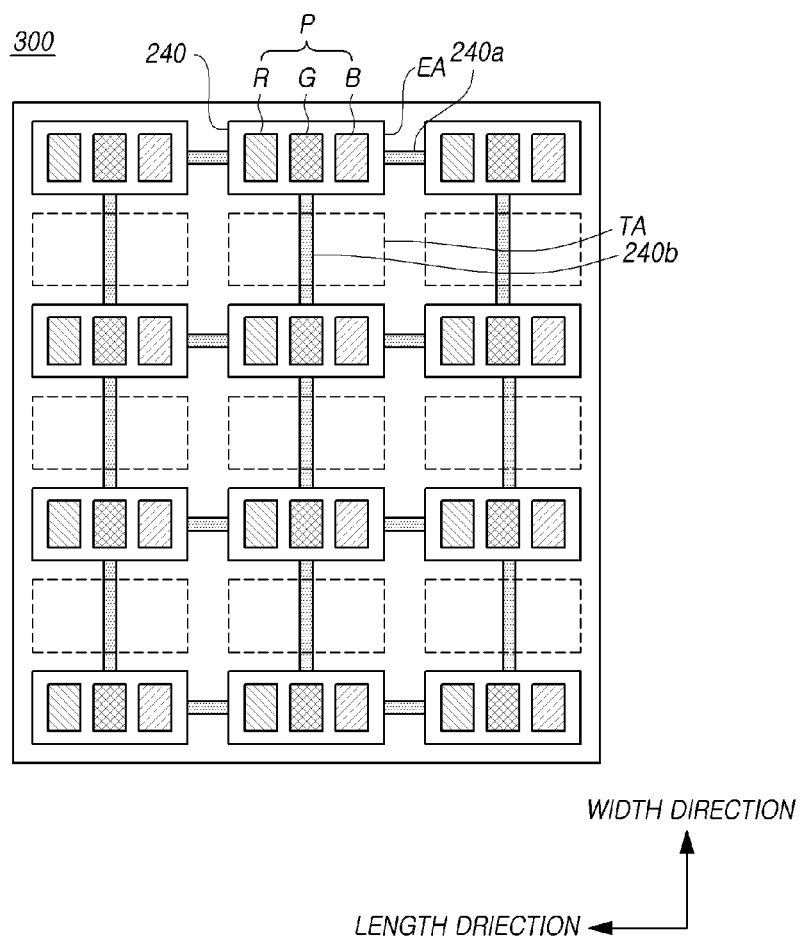
FIGS. 4 and 5 are plan views of a transparent display panel according to another embodiment.
Figure 5:
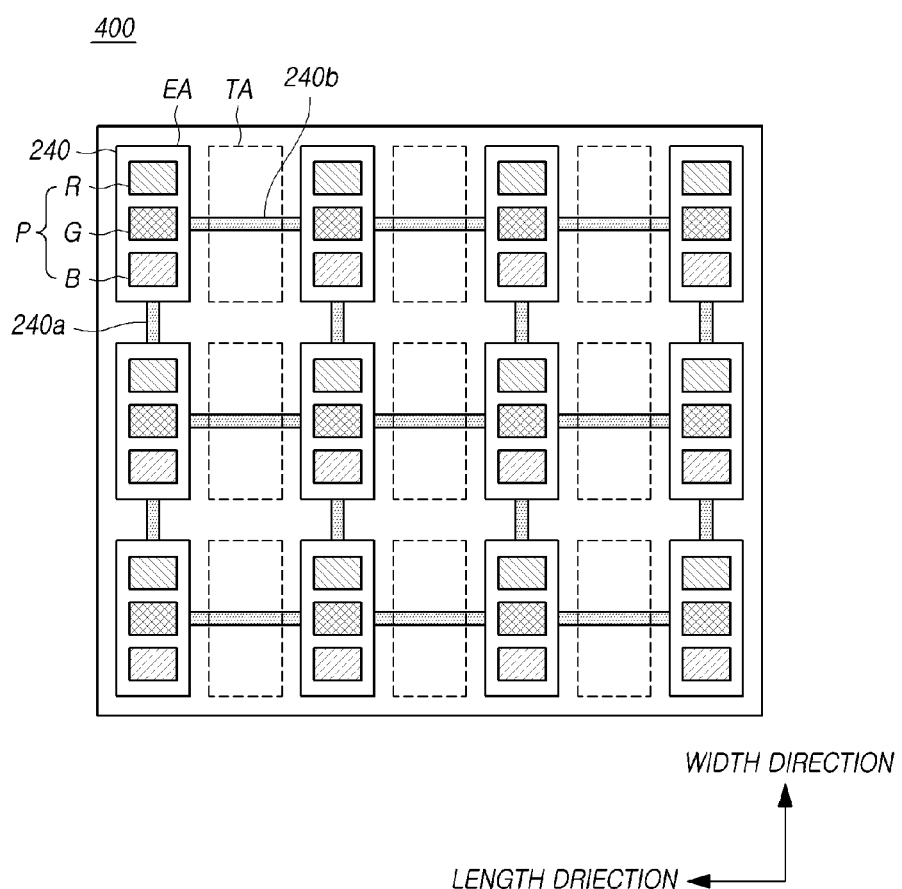

FIGS. 4 and 5 are plan views illustrating transparent display panels according to another embodiment.

Referring to FIGS. 4 and 5, transparent display panels 300 and 400 according to other embodiments include one pixel P including two or more subpixels, for example, a red subpixel R emitting red light, a green subpixel G emitting green light, and a blue subpixel B emitting blue light, in each emission area EA.

The subpixels R, G, and B may be disposed in the length direction as illustrated in FIG. 4 or may be disposed in the width direction as illustrated in FIG. 5. The direction in which the subpixels R, G, and B are arranged matches the direction of the cathodes 240 connected via the first bridge 240a. The direction of the cathodes 240 matches the direction of openings or holes of a mask which is used to form the cathodes 240 in a deposition process as will be described later with reference to FIGS. 16 and 17.

Figure 10:
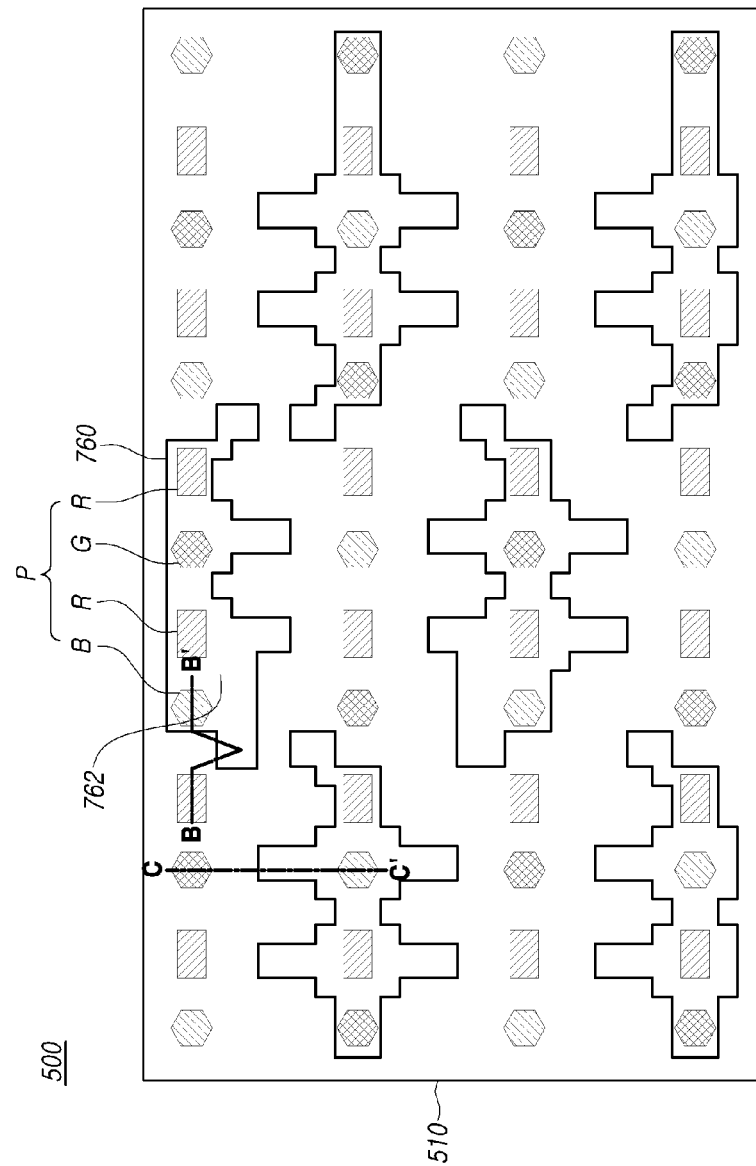
FIGS. 10 to 15 are diagrams illustrating process steps of forming a cathode in FIG. 9 according to an embodiment.
Figure 12:
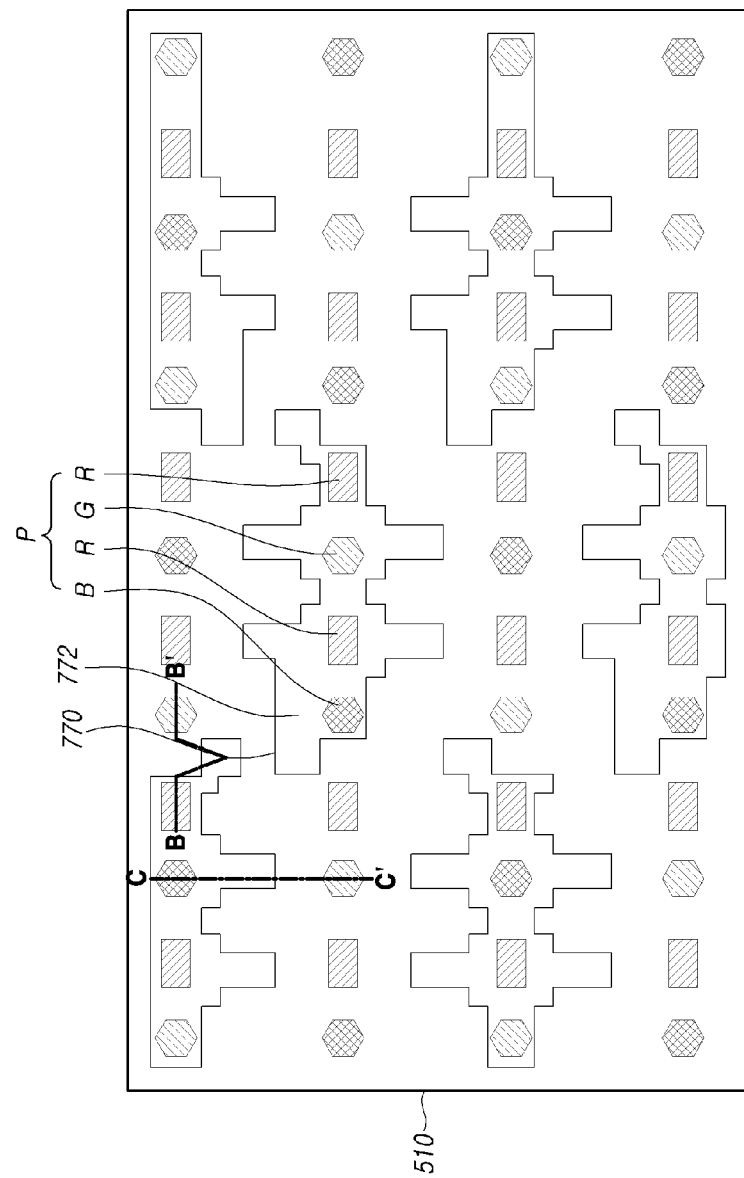

Accordingly, one pixel P includes subpixels emitting light of colors (for example, white and yellow) other than red, green, and blue. One pixel P may additionally include a subpixel emitting light of the same color as red, green, or blue. For example, as illustrated in FIGS. 10 and 12, one pixel P may include subpixels B, R, G, and R emitting blue, red, green, and red.

Each subpixel R, G, or B includes a circuit portion in which a circuit element such as a transistor is disposed to allow the emission area EA to emit light. The circuit portion of each subpixel R, G, or B refers to a circuit including a transistor that supplies a voltage or a current to an anode or a pixel electrode of each subpixel R, G, or B to allow the corresponding emission area to emit light or an area in which such a circuit is disposed.

The emission area of each subpixel R, G, or B may refer to an area that emits light of the corresponding color for each subpixel R, G, or B, may refer to an anode or a pixel electrode which is provided for each subpixel R, G, or B, or may refer to an area in which an anode or a pixel electrode is disposed.

Figure 6:
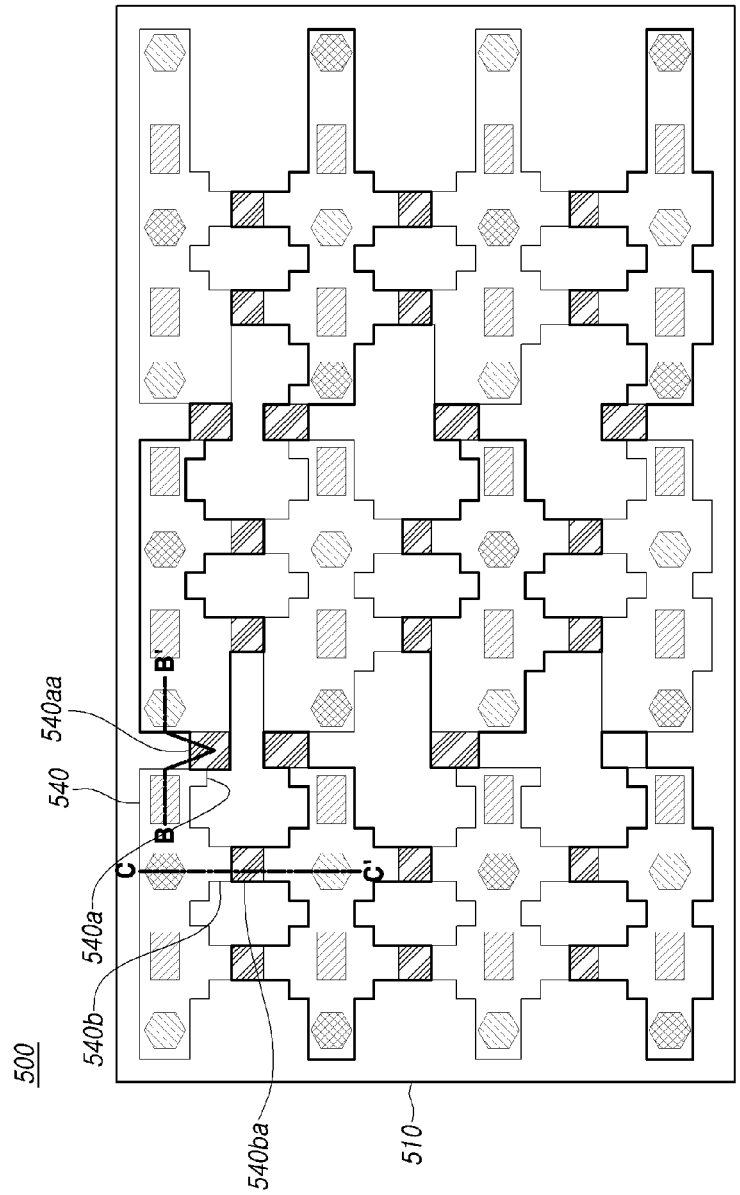
FIG. 6 is a plan view of a transparent display panel according to another embodiment.
Figure 7:
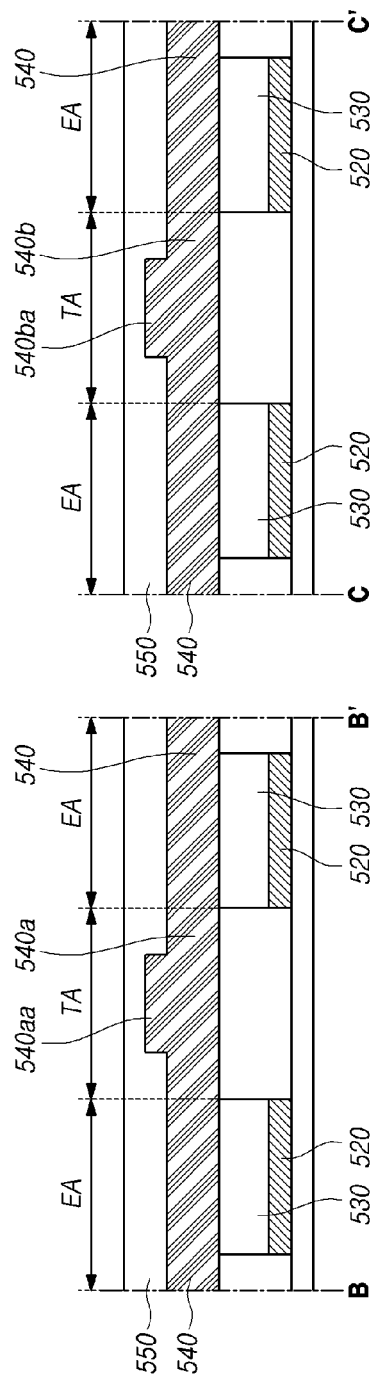
FIG. 7 is a sectional view taken along line B-B' and line C-C' in FIG. 6 according to an embodiment.

FIG. 6 is a plan view of a transparent display panel according to another embodiment. FIG. 7 is a sectional view taken along line B-B' and line C-C' in FIG. 6 according to another embodiment.

Referring to FIGS. 6 and 7, a transparent display panel 500 according to another embodiment, cathodes 540 overlapping each other are located between the cathodes 540 adjacent to each other in the emission areas EA adjacent to each other.

For example, when emission areas EA are adjacent to each other, the cathode disposed in each emission area EA is connected to the cathode 540 disposed in the emission area EA adjacent thereto via a first bridge 540a. The first bridge 540a includes a first overlap portion 540aa with the total thickness of the overlapping cathodes 540 between the cathodes 540 adjacent to each other.

In the transparent display panel 500, when emission areas EA are adjacent to each other with a transmission area TA interposed therebetween, cathodes 540 overlapping each other are located in the transmission area TA between the cathodes 540 adjacent to each other.

For example, in the transparent display panel 500, when emission areas EA are adjacent to each other with a transmission area TA interposed therebetween, the cathode 540 disposed in each emission area EA is connected to the cathode 540 disposed in the emission area EA adjacent thereto via a second bridge 540b. The second bridge 540b includes a second overlap portion 540ba with the total thickness of the overlapping cathodes 540 between the cathodes 540 adjacent to each other.

In FIG. 6, the cathode 540 disposed in each emission area EA is connected to the cathode 540 disposed in the emission area EA adjacent thereto via two second bridges 540b. However, the cathode 540 disposed in each emission area EA may also be connected to the cathode 540 disposed in the emission area EA adjacent thereto via one second bridge 540b.

In FIG. 6, the cathode 540 disposed in each emission area EA is connected to the cathode 540 disposed in the emission area EA adjacent thereto via the first and second bridges 540a and 540b. However, the cathode 540 disposed in each emission area EA may be connected to the cathode 540 disposed in the emission area EA adjacent thereto via only one of the first bridge 540a and the second bridge 540b.

For example, n (where n is a natural number greater than 2) cathodes 540 disposed in the emission areas EA are connected to the cathodes 540 disposed in the emission areas adjacent to each other via the second bridges 540b, and the cathodes 540 disposed therebetween may not include the second bridge 540b. Accordingly, it is possible to enhance the transparency of the transmission areas TA.

In FIG. 7, the first and second overlap portions 540aa and 540ba are located substantially in the middle of the first and second bridges 540a and 540b, but the present disclosure is not limited thereto and the first and second overlap portions may be located at any position. The second overlap portion 540ba may not be disposed in the transmission areas TA but may be disposed in a part of the emission areas EA.

Figure 8:
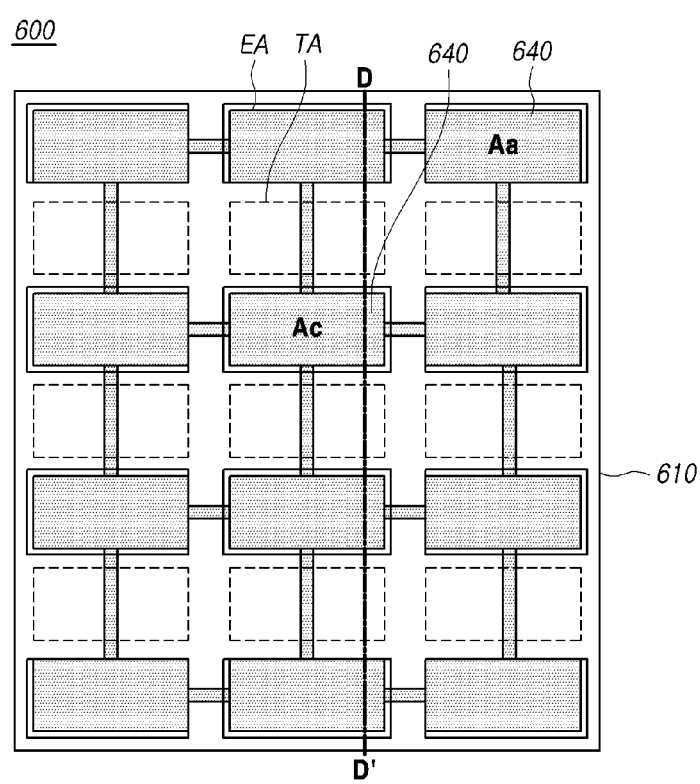
FIG. 8 is a plan view of a transparent display panel according to another embodiment.

FIG. 8 is a plan view of a transparent display panel according to another embodiment.

Referring to FIG. 8, in a transparent display panel 600 according to another embodiment, the area Ac of a cathode 640 disposed in an emission area EA located in the vicinity of the center of a substrate 610 is greater than the area Aa of the cathode 640 disposed in an emission area EA located in the vicinity of the edge of the substrate 610. A difference between the areas Ac and Aa of the cathodes 640 is set in consideration of a process of forming the cathode 640. This will be described later with reference to FIG. 18.

The transparent display panels 200 to 600 according to the embodiments have been described above with reference to FIGS. 2 to 8. Methods of manufacturing the transparent display panels 200 to 600 will be described below with reference to FIGS. 9 to 18.

Figure 9:
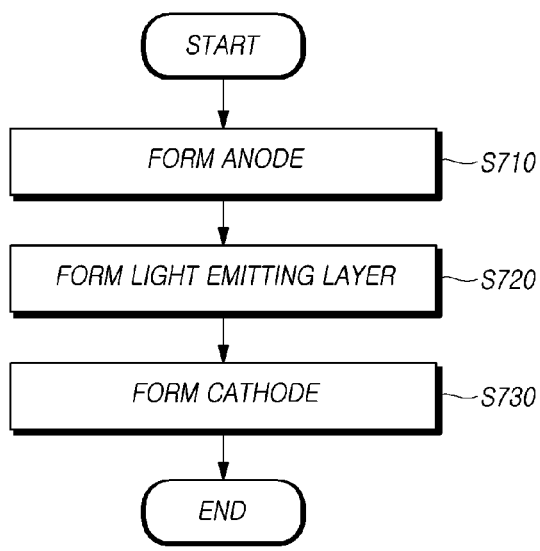
FIG. 9 is a plan view illustrating a method of manufacturing a transparent display panel according to an embodiment.

FIG. 9 is a flowchart illustrating a method of manufacturing a transparent display panel according to another embodiment.

Referring to FIG. 9, a method 700 of manufacturing a transparent display panel according to another embodiment includes a step S710 of forming an anode in each emission area out of a plurality of emission areas and a plurality of transmission areas on a substrate, a step S720 of forming a light emitting layer on the anode in each emission area out of the plurality of emission areas and the plurality of transmission areas on the substrate, and a step S730 of forming a patterned cathode, in which at least a part of the transmission area is open, on the light emitting layer formed on the substrate in the emission areas and the transmission areas.

With the method 700 of manufacturing a transparent display panel which is described above with reference to FIG. 9, the transparent display panels 200 to 600 according to the embodiments described above with reference to FIGS. 2 to 8 can be manufactured.

As described above with reference to FIGS. 2 to 6, the cathode disposed in each emission area EA is electrically connected to the cathode disposed in the emission area TA adjacent thereto. When the emission areas EA are adjacent to each other, the cathode disposed in each emission area EA is connected to the cathode disposed in the emission area EA adjacent thereto. When the emission areas EA are adjacent to each other with a transmission area TA interposed therebetween, the cathode disposed in each emission area EA is connected to the cathode disposed in the emission area EA adjacent thereto via the transmission area TA.

As described above, the steps can be performed using general processes of manufacturing a display panel such as a deposition process using a mask such as a fine metal mask (FMM) or a lithography process using a photoresist.

For example, in the step S730 of forming a patterned cathode, a patterned cathode in which at least a part of a transmission area TA is open can be formed on light emitting layers which are formed on the substrate in the emission areas EA and the transmission areas TA through a deposition process using a mask such as a fine metal mask (FMM) or a lithography process using a photoresist.

When a photoresist is used, a negative photoresist or a positive photoresist can be employed. When a negative photoresist is used, the photoresist is applied and is then exposed to UV to develop the photoresist and to dispose the photoresist in only at least a part of the transmission area TA.

By performing the method of manufacturing a transparent display panel according to another embodiment, it is possible to manufacture the transparent display panel including the "patterned cathode." Accordingly, it is possible to improve total transparency of the transparent display panel.

It will be described below that the patterned cathode is formed by performing a deposition process using a mask such as a fine metal mask (FMM), and the present disclosure is not limited thereto.

FIGS. 10 to 15 are process diagrams illustrating the step of forming a cathode in FIG. 9.

Figure 11:
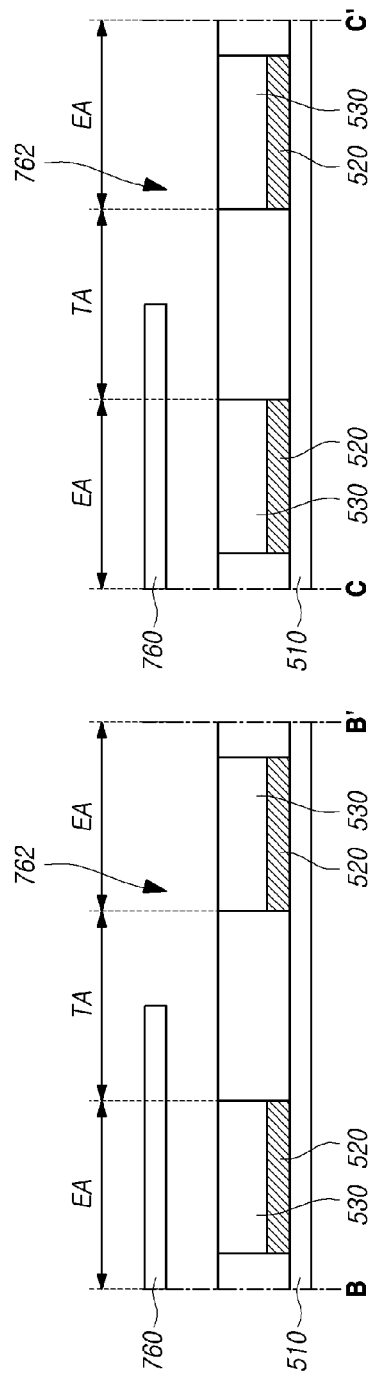
Figure 13:
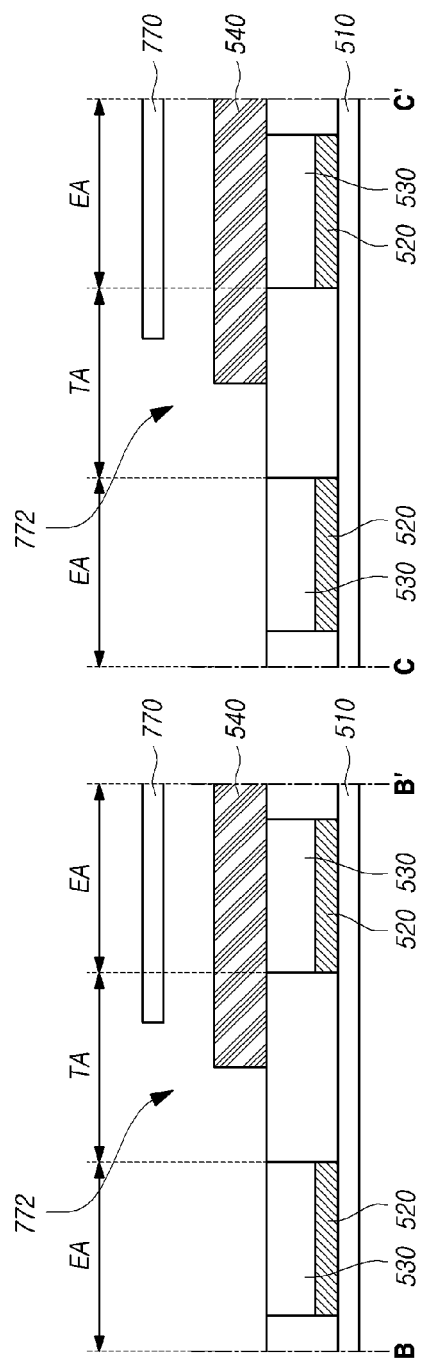

The step S730 of forming a cathode in FIG. 9 includes forming a part of the cathode 540 in a part of emission areas EA using a first mask 760 including a first open portion 762 in which a part of emission areas EA is open as illustrated in FIGS. 10 and 11 and forming another part of the cathode 540 using a second mask 770 including a second open portion 772 in which another part of emission areas EA is open as illustrated in FIGS. 12 and 13.

The order of use of the first mask 760 and the second mask 770 can be reversed. The order of formation of a part of the cathode 540 formed using the first mask 760 as illustrated in FIGS. 10 and 11 and another part of the cathode 540 formed using the second mask 770 including the second open portion 772 as illustrated in FIGS. 12 and 13 can be reversed.

The first and second masks 760 and 770 overlap each other in open parts of the emission areas EA adjacent to each other when the emission areas EA are directly adjacent to each other, and overlap each other in open parts of the emission areas EA adjacent to each other when the emission areas EA are adjacent to each other with a transmission area TA interposed therebetween.

Figure 14:
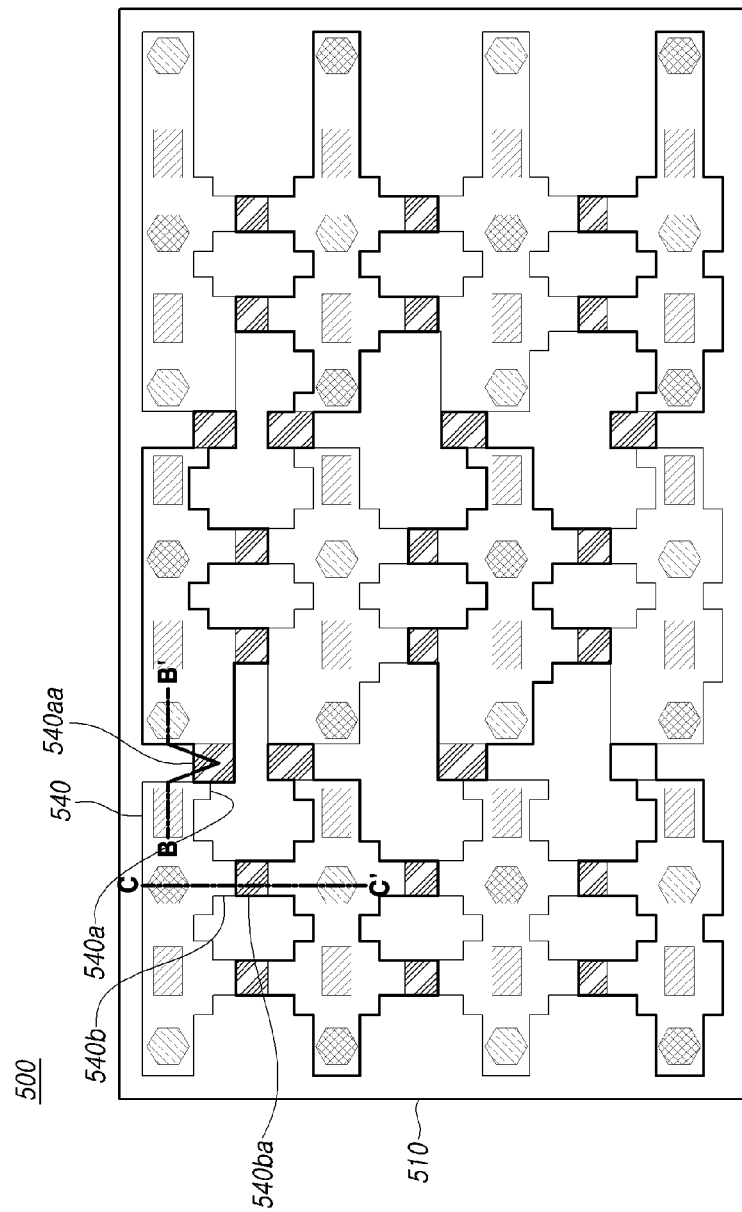
Figure 15:
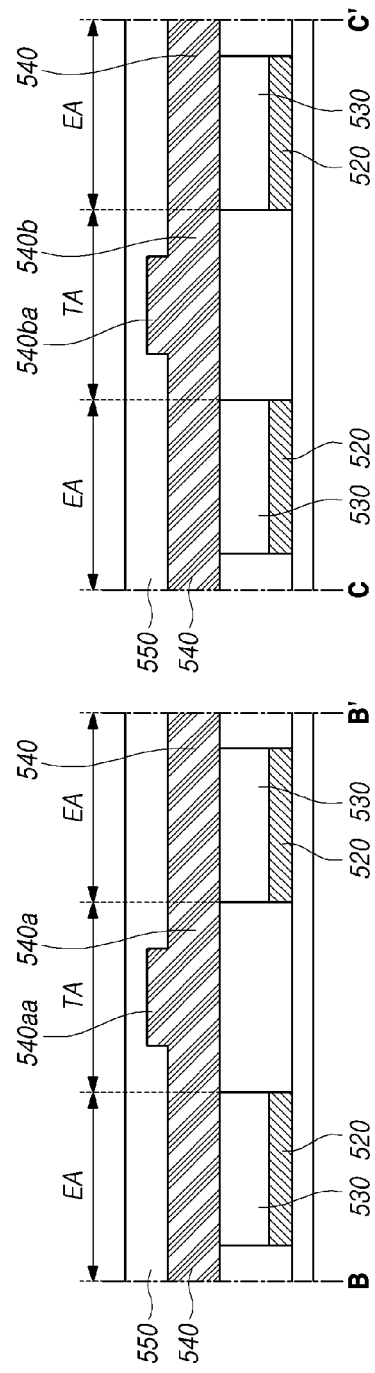

Referring to FIGS. 14 and 15, in the transparent display panel 500 according to another embodiment, when the emission areas EA are directly adjacent to each other, the cathode 540 disposed in each emission area EA is connected to the cathode 540 disposed in the emission area adjacent thereto via a first bridge 540a. A first overlap portion 540aa with the total thickness of the cathodes 540 between the cathodes 540 directly adjacent to each other is disposed in the first bridge 540a.

When the emission areas EA are adjacent to each other with a transmission area TA interposed therebetween in the transparent display panel 500, the cathode 540 disposed in each emission area EA is connected to the cathode 540 disposed in the emission area EA adjacent thereto via a second bridge 540b. A second overlap portion 540ba with the total thickness of the cathodes 540 between the cathodes 540 adjacent to each other is disposed in the second bridge 540b.

The step of forming a part of the cathode 540 using the first mask 760 as illustrated in FIGS. 10 and 11 and the step of forming another part of the cathode 540 using the second mask 770 as illustrated in FIGS. 12 and 13 are the same except for different patterns in the masks.

Accordingly, the cathodes are the same in the entire shape, the thickness, the pattern, and the like except for the first and second overlap portions 540aa and 540ba. That is, the first and second overlap portions 540aa and 540ba have a structure in which a part of the cathode formed using the first mask 760 and another part of the cathode formed using the second mask 770 as illustrated in FIGS. 12 and 13 overlap each other by performing two deposition processes.

On the other hand, a part of the cathode formed using the first mask 760 as illustrated in FIGS. 10 and 11 and another part of the cathode formed using the second mask 770 as illustrated in FIGS. 12 and 13 may be formed of different materials or with different thicknesses. A part of the cathode formed using the first mask 760 and another part of the cathode formed using the second mask 770 with the second open portion 772 may have different patterns.

If the cathode 540 can be formed through one deposition process, the number of deposition steps can be reduced or minimized, but a part of the mask has to have an island shape and thus manufacturing of such a mask is not possible. Accordingly, in the method of depositing the patterned cathode, a common electrode can be formed by sequentially performing the first pattern deposition and the second pattern deposition.

Overlapping portions which are located on the same subpixels R, G, and B at the time of first pattern deposition and the second pattern deposition and which overlap each other after the first pattern deposition and the second pattern deposition, that is, the first and second overlap portions 540aa and 540ba, are provided. The present disclosure is not limited to the second pattern deposition depending on the resolution of the transparent display panel 500, and more pattern depositions can be performed.

Known materials can be used as the material of the cathode deposition pattern, and deposition materials functioning as an electrode can be used.

Since the transparent display panel 500 includes the patterned cathode 540, it is possible to improve the transparency.

Figure 16:
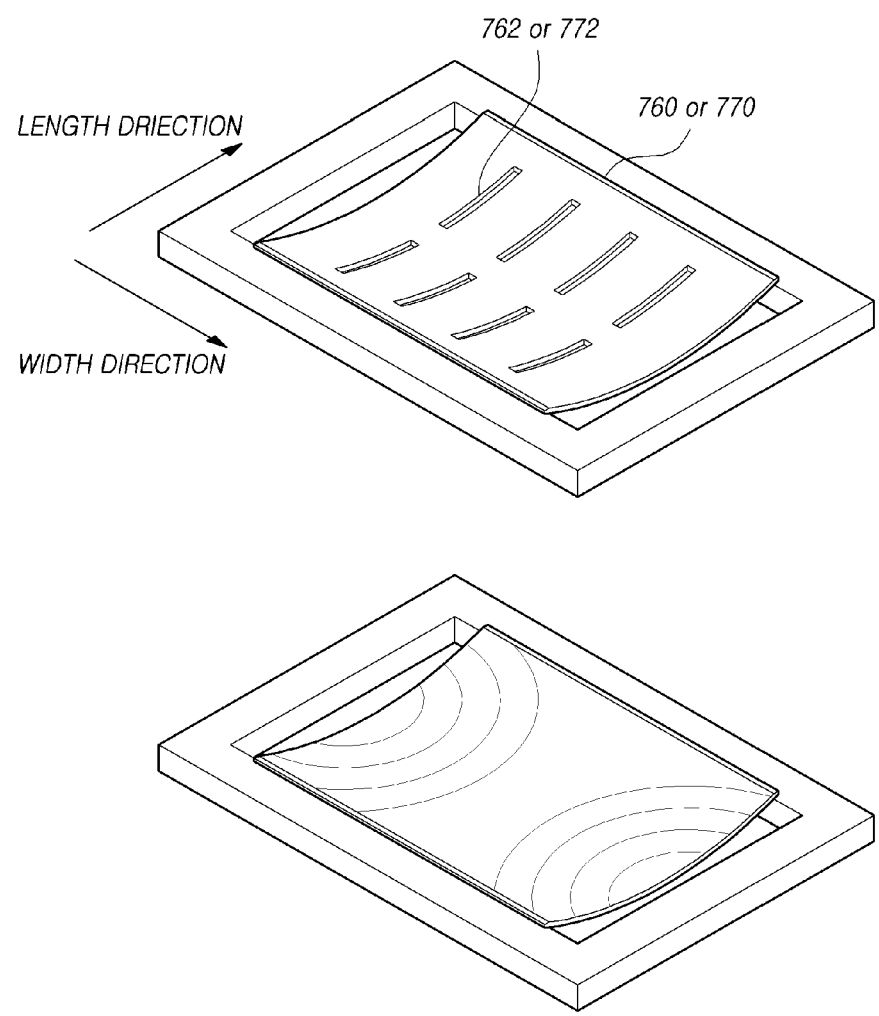
FIG. 16 is a perspective view illustrating an example of first and second masks which are used in FIGS. 10 to 13 according to an embodiment.

FIG. 16 is a perspective view illustrating an example of the first and second masks which are used in FIGS. 10 to 13 according to an embodiment. FIG. 17 is a perspective view illustrating another example of the first and second masks which are used in FIGS. 10 to 13 according to another embodiment.

As described above with reference to FIGS. 4 and 5, each emission area includes one pixel including two or more subpixels and the subpixels are arranged in the length direction or the width direction.

The first and second masks 760 and 770 may be open in the direction of the subpixels. For example, in the first and second masks 760 and 770, open portions 762 and 772 may be arranged in the length direction as illustrated in FIG. 16 or may be arranged in the width direction as illustrated in FIG. 17.

Figure 18:
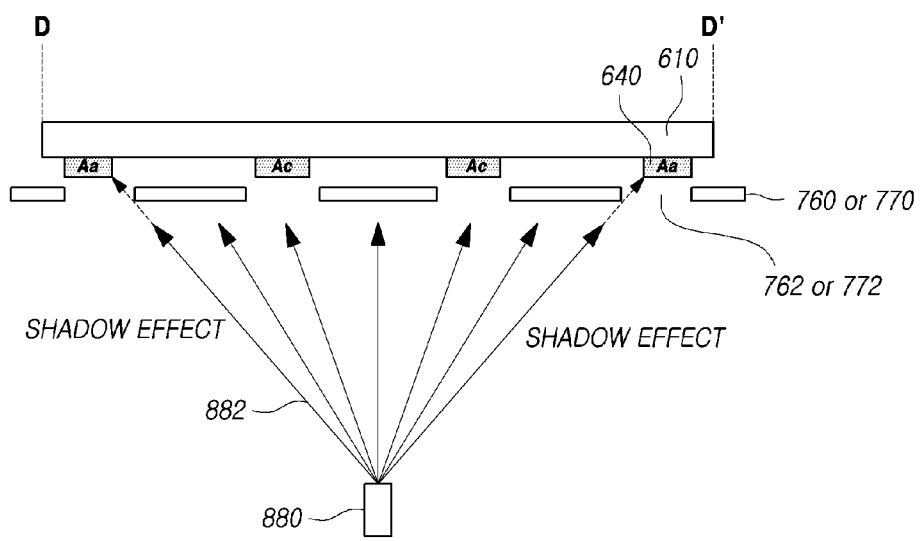
FIG. 18 is a diagram illustrating a mask which is used to manufacture the transparent display panel illustrated in FIG. 8 and a deposition process using deposition equipment according to an embodiment.

FIG. 18 is a diagram illustrating masks which are used to manufacture the transparent display panel illustrated in FIG. 8 and a deposition process using deposition equipment according to an embodiment.

FIG. 18 illustrates a cross-section taken along line D-D' of the transparent display panel illustrated in FIG. 8 during the process of manufacturing the transparent display panel and other elements other than the substrate 610 and the cathodes 640 are omitted.

In the step S730 of forming a cathode in FIG. 9, a cathode material 882 in a crucible 880 located in the vicinity of the center of the deposition equipment 800 in FIG. 18 is heated and the cathode 640 is deposited on the substrate 610 using the first and second masks 760 and 770 as illustrated in FIG. 18.

As illustrated in FIG. 18, the open portions 762 and 772 of the first and second masks 760 and 770 may have an area corresponding to the emission areas.

Here, due to a shadow effect, the area Aa of the cathode 640 disposed in an emission area EA located in the vicinity of the edge of the substrate 610 is greater than the area Ac of the cathode 640 disposed in an emission area EA located in the vicinity of the center of the substrate 610.

As described above with reference to FIGS. 16 to 18, the shape of the FMM can be optimized in consideration that thermal deformation increases as the temperature of the FMM used for the first and second masks 760 and 770 increases at the time of deposition of the patterned cathode in the method of manufacturing the transparent display panel.

Local warpage can be reduced or minimized by improving adhesiveness between the substrate 610 and the FMM in the deposition equipment 800.

In view of optical efficiency, a microcavity effect can be increased or maximized by increasing the thickness of the cathode without decreasing transparency in comparison with a known cathode deposition structure using an open metal mask.

For example, the thickness of the first or second mask 760 or 770 which is used to form the patterned cathode in the deposition equipment 800 can be sufficiently increased in consideration of the local warpage and the microcavity effect.

Here, the area of the open portion 762 or 772 of the first or second mask 760 or 770 can be increased in consideration of the shadow effect at the time of deposition based on the thickness of the first or second mask 760 or 770. The area of the open portion 762 or 772 in a part in which the shadow effect does not work or works less can be decreased and the area of the open portion 762 or 772 in a part in which the shadow effect works can be the same in proportion to the effect.

As illustrated in FIG. 18, in the first or second mask 760 or 770, the areas of the open portions 762 or 772 corresponding to the emission areas EA can be the same for the purpose of easiness of manufacturing a mask.

Due to the shadow effect, the area Ac of the cathode 640 disposed in an emission area EA located in the vicinity of the center of the substrate 610 is greater than the area Aa of the cathode 640 disposed in an emission area EA located in the vicinity of the edge of the substrate 610.

With the transparent display panel and the manufacturing method thereof according to the embodiments of the present disclosure, it is possible to improve transparency as a whole due to the patterned cathode. Accordingly, it is possible to commercialize the transparent display panel.

Other embodiments of the present disclosure can provide a display device. The display device includes a display panel and driving circuits that drive the display panel. In the display device according to the embodiments, the display panel is the same as the display panels 100 to 400 according to the above embodiments of the present disclosure and thus description of the display panel will not be repeated.

The driving circuits included in the display device according to the embodiments of the present disclosure are the same as described above and thus will not be described herein.

While embodiments of the present disclosure have been described above in detail with the accompanying drawings, the present disclosure is not limited to the embodiments and can be modified in various forms without departing from the technical idea of the present disclosure. Accordingly, the embodiments of the present disclosure are not for defining the technical idea of the present disclosure but for describing the technical idea, and the scope of the technical idea of the present disclosure is not limited to the embodiments. The embodiments described above should be construed to be exemplary but not definitive in all respects. The scope of the present disclosure is defined by the appended claims and all technical ideas within the scope equivalent thereto should be construed to belong to the scope of the present disclosure.

What is claimed is:

1. A transparent display panel comprising:
a substrate on which a plurality of emission areas and a plurality of transmission areas are defined;
a plurality of subpixels, each of the plurality of subpixels including an organic light emitting diode and a driving transistor driving the organic light emitting diode, and at least two of the plurality of subpixels included in each of the plurality of emission areas;
an anode disposed in each of the plurality of emission areas;
a light emitting layer disposed on the anode in each of the plurality of emission areas;
a patterned cathode disposed on the light emitting layer in each of the plurality of emission areas, and disposed in at least a part of each of the plurality of transmission areas, at least a part of at least one of the plurality of transmission areas being open; and
a first bridge disposed in the at least one of the plurality of transmission areas, and connecting the respective patterned cathodes of adjacent two emission areas of the plurality of emission areas between which the at least one transmission area is disposed,
wherein the at least one transmission area comprises a first portion in which the first bridge is disposed, and a second portion in which the first bridge is not disposed, and
wherein at least a part of the first bridge has a thickness greater than that of the patterned cathode.

2. The transparent display panel according to claim 1, wherein the patterned cathode disposed in each of the plurality of emission areas is electrically connected to the patterned cathode disposed in the emission area adjacent thereto.

3. The transparent display panel according to claim 2, wherein, when the emission areas are directly adjacent to each other, the patterned cathode disposed in each of the plurality of emission areas is connected to the patterned cathode disposed in the emission area adjacent thereto via a second bridge.

4. The transparent display panel according to claim 3, wherein the first bridge includes a first overlap portion with a total thickness of the patterned cathodes adjacent to each other between the cathodes, and
wherein the second bridge includes a second overlap portion with a total thickness of the patterned cathodes adjacent to each other between the cathodes.

5. The transparent display panel according to claim 1, wherein the subpixels are arranged in a length direction or a width direction.

6. The transparent display panel according to claim 1, wherein an area of the patterned cathode disposed in the emission area located in the vicinity of an edge of the substrate is greater than an area of the patterned cathode disposed in the emission area located in the vicinity of a center of the substrate.

7. The transparent display panel according to claim 1, wherein the plurality of subpixels include at least one red subpixel, at least one green subpixel, and at least one blue subpixel.

8. The transparent display panel according to claim 1, further comprising: a plurality of data lines and a plurality of gate lines, by which the plurality of subpixels are defined.

9. The transparent display panel according to claim 8, further comprising:
a data driving circuit driving the plurality of data lines;
a gate driving circuit driving the plurality of gate lines; and
a controller controlling the data driving circuit and the gate driving circuit.

10. The transparent display panel according to claim 9, wherein the controller is configured to supply various control signals to the data driving circuit and the gate driving circuit to control the data driving circuit and the gate driving circuit.

* * * * *